(12) United States Patent
Kushnarenko

(10) Patent No.: US 6,532,176 B1
(45) Date of Patent: Mar. 11, 2003

(54) NON-VOLATILE MEMORY ARRAY WITH EQUALIZED BIT LINE POTENTIALS

(75) Inventor: Alexander Kushnarenko, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/963,912

(22) Filed: Sep. 25, 2001

(51) Int. Cl.$^7$ .............................................. G11C 16/06
(52) U.S. Cl. ............................ 365/185.25; 365/189.09; 365/230.06
(58) Field of Search ........................ 365/185.25, 185.03, 365/189.09, 230.06

(56) References Cited

U.S. PATENT DOCUMENTS

| | | | | |
|---|---|---|---|---|
| 4,964,083 A | * | 10/1990 | Nogle et al. ............ | 365/189.11 |
| 5,384,742 A | * | 1/1995 | Miyakawa et al. ..... | 365/185.12 |
| 5,563,842 A | * | 10/1996 | Challa .................... | 365/189.09 |
| 5,815,449 A | * | 9/1998 | Taura ..................... | 365/189.07 |
| 6,335,878 B1 | * | 1/2002 | Yamada et al. ......... | 365/185.03 |

* cited by examiner

*Primary Examiner*—David Nelms
*Assistant Examiner*—Tu-Tu Ho
(74) *Attorney, Agent, or Firm*—E. Eric Hoffman; Bever, Hoffman & Harms, LLP

(57) ABSTRACT

A non-volatile memory (NVM) system that includes an array of NVM cells arranged in rows and columns and an equalization control circuit is provided. One row of the array forms a row of equalization NVM cells. Each of the equalization NVM cells is erased, such that these cells exhibit a low threshold voltage during normal operation of the array. The equalization control circuit detects the beginning of each new read cycle, and in response, activates an equalization control signal. The activated equalization control signal is applied to the row of equalization NVM cells, thereby turning on these cells. The turned on equalization NVM cells connect the bit lines of the array, thereby allowing the bit lines to discharge (equalize) at the beginning of each read cycle. The equalization control signal is de-activated prior to the bit line sensing period of the read cycle.

19 Claims, 4 Drawing Sheets

NON-VOLATILE MEMORY ARRAY WITH EQUALIZED BIT LINE POTENTIALS

FIELD OF THE INVENTION

The present invention relates to non-volatile memory structures, and more particularly, to methods and apparatus for charging, discharging or equalizing potentials in a non-volatile memory array to provide conditions for sensing non-volatile memory cells in the array.

DISCUSSION OF RELATED ART

Non-volatile memory arrays include a plurality of non-volatile memory (NVM) cells arranged in rows and columns. In general, single-transistor n-channel NVM cells operate as follows. During an erase operation, electrons are removed from a floating gate of the NVM cell, thereby lowering the threshold voltage of the NVM cell. During a program operation, electrons are inserted into the floating gate of the NVM cell, thereby raising the threshold voltage of the NVM cell. Thus, during program and erase operations, the threshold voltages of selected NVM cells are changed. During a read operation, read voltages are applied to selected NVM cells. In response, read currents flow through these selected NVM cells. The magnitudes of the read currents are dependent upon the threshold voltages of the selected NVM cells.

FIG. 1 is a flow diagram of a typical read cycle algorithm, which includes Steps 101–108. After starting the read cycle (Step 101), an address corresponding with the selected NVM cells is decoded (Step 102). In response, a first read voltage is applied to a selected row, or word line (Step 103), and a second read voltage is applied to selected columns, or bit lines (Step 104). The resulting read currents are sensed by corresponding sense amplifiers (Step 105) to determine whether the corresponding NVM cells have programmed or erased states (i.e., high or low threshold voltages). The sensed data values are then provided as output data values (Step 106), thereby completing the read operation (Step 107). Note that after the read currents have been sensed, the selected bit lines are prepared for the next memory cycle (Step 108). Typically, this involves pre-charging or equalizing the selected bit lines to a predetermined voltage.

FIG. 2 is a circuit diagram of a portion of a conventional non-volatile memory array 200, which includes NVM cells 201–204, word line 210 and bit lines $BL_A$, $BL_B$ and $BL_C$. Bit lines are modeled using resistors 221–226 and capacitors 231–233.

During a first read cycle, NVM cell 202 is selected (Steps 101–102). Thus, a first read voltage is applied to word line 210 during the first read cycle (Step 103). In addition, voltage source 241 is coupled to $BL_A$ during the first read cycle, thereby applying the second read voltage $V_X$ to bit line $BL_A$ (Step 104). Sense amplifier 251 is coupled to bit line $BL_B$ during the first read cycle (Step 104). Under these conditions, a first read current $I_{AB}$ flows through NVM cell 202. Sense amplifier 251 senses the magnitude of this read current $I_{AB}$ to determine the state of NVM cell 202 (Step 105). In the described example, NVM cell 202 is programmed to a high threshold voltage, such that sense amplifier 251 identifies a logic low read current. A data amplifier (not shown) coupled to sense amplifier 251 provides the low data output signal (Step 106). Bit line $BL_B$, which becomes charged during the read operation, is discharged after the data value has been sensed (Step 108). Normally, the voltage on word line 210 remains activated at the first read voltage while bit line $BL_B$ is being discharged. As a result, bit line $BL_A$ is discharged to an acceptable level through NVM cell 202.

However, if non-volatile memory array 200 is operated in an asynchronous manner, it is possible for a second read cycle to interrupt the first read cycle. In this case, the second read cycle will cause the voltage on word line 210 to be de-activated low while bit line $BL_B$ is being discharged. As a result, a relatively large charge $Q_X$ is stored (trapped) on bit line $BL_A$ (i.e., capacitor 231).

In the described example, NVM cell 203, which is programmed to a high threshold voltage, is selected during the second read cycle. Thus, the first read voltage is applied to word line 210 during the second read cycle. In addition, voltage source 242 is coupled to bit line $BL_C$ during the second read cycle, thereby applying the read voltage $V_Y$ to bit line $BL_C$ (Step 104). Sense amplifier 251 is coupled to bit line $BL_B$ during the second read cycle (Step 104). Under these conditions, a small read current $I_{CB}$ flows through NVM cell 203 to sense amplifier 251.

In addition, because bit line $BL_A$ was not previously discharged, sense amplifier 251 receives a small current $I_{AB}$, associated with the charge $Q_X$ stored on bit line $BL_A$. As a result, the actual read current on bit line $BL_B$ is equal to the current through NVM cell 203 (from read voltage $V_Y$), plus the current through NVM cell 202 (from trapped charge $Q_X$). Thus, the actual read current provided to sense amplifier 251 on bit line $BL_B$ is about twice as high as the desired read current $I_{CB}$.

Sense amplifier 251 senses the magnitude of the actual read current to determine the state of NVM cell 203 (Step 105). In the described example, it is possible that sense amplifier 251 will erroneously determine that NVM cell 203 has an erased state (i.e., a low threshold voltage) in response to the relatively high actual read current.

Note that the address of the second read cycle can be selected randomly, so it is not possible to predict which bit lines must be discharged prior to the second read cycle. Thus, conventional non-volatile memory systems require that all bit lines involved in a read operation be discharged before the next read cycle begins. As a result, the operating speed of these non-volatile memory systems is reduced, and the operating power of these non-volatile memory systems is increased. Moreover, conventional non-volatile memory systems are typically divided into several blocks, whereby each block must be activated for each discharge operation, thereby resulting in very high power consumption.

It would therefore be desirable to have a memory system that overcomes the above-described deficiencies of conventional non-volatile memory systems.

SUMMARY

Accordingly, the present invention provides a non-volatile memory (NVM) system that includes an array of NVM cells arranged in rows and columns, wherein each column of NVM cells shares a common bit line with an adjacent column of NVM cells. One row of the array forms a dedicated row of equalization NVM cells. Each of the equalization NVM cells is initially erased, such that these equalization NVM cells exhibit a low threshold voltage during normal operation of the array. After the equalization NVM cells have been erased, these cells are not programmed, erased, or read during normal operation of the array.

An equalization control circuit is configured to detect the beginning of each read cycle. In one embodiment, the equalization control circuit receives an access enable signal and a read/write indicator signal, which are both activated at the beginning of each read cycle. Upon detecting the beginning of a read cycle, the equalization control circuit activates an equalization control signal. The activated equalization control signal is applied to the word line of the row of equalization NVM cells, thereby turning on these equalization NVM cells. The turned on equalization NVM cells electrically connect the bit lines of the array, thereby causing the bit lines to discharge (i.e., equalize) at the beginning of each read cycle. The equalization control signal is de-activated after the bit lines have had an opportunity to discharge, but prior to a bit line sensing period of the read cycle.

Because the bit lines are discharged at the beginning of each read cycle, minimal charges remain on the bit lines during the sensing period. As a result, bit line charges will not result in erroneous read results, even if a first read cycle is interrupted by a second read cycle.

The present invention will be more fully understood in view of the following description and drawings.

DETAILED DESCRIPTION

Figure 1:
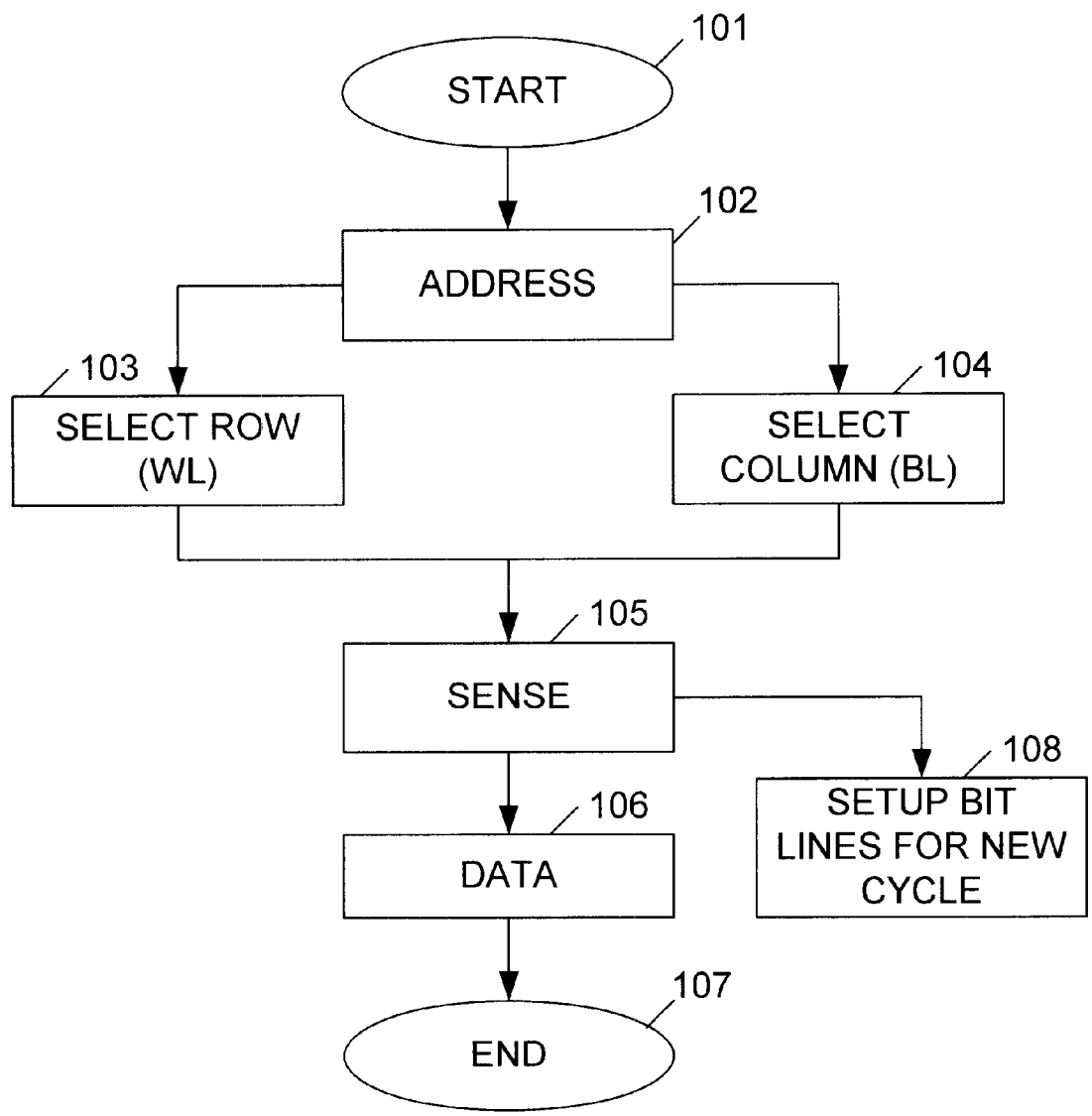
FIG. 1 is a flow diagram of a typical read cycle algorithm, which includes Steps 101–108.
Figure 2:
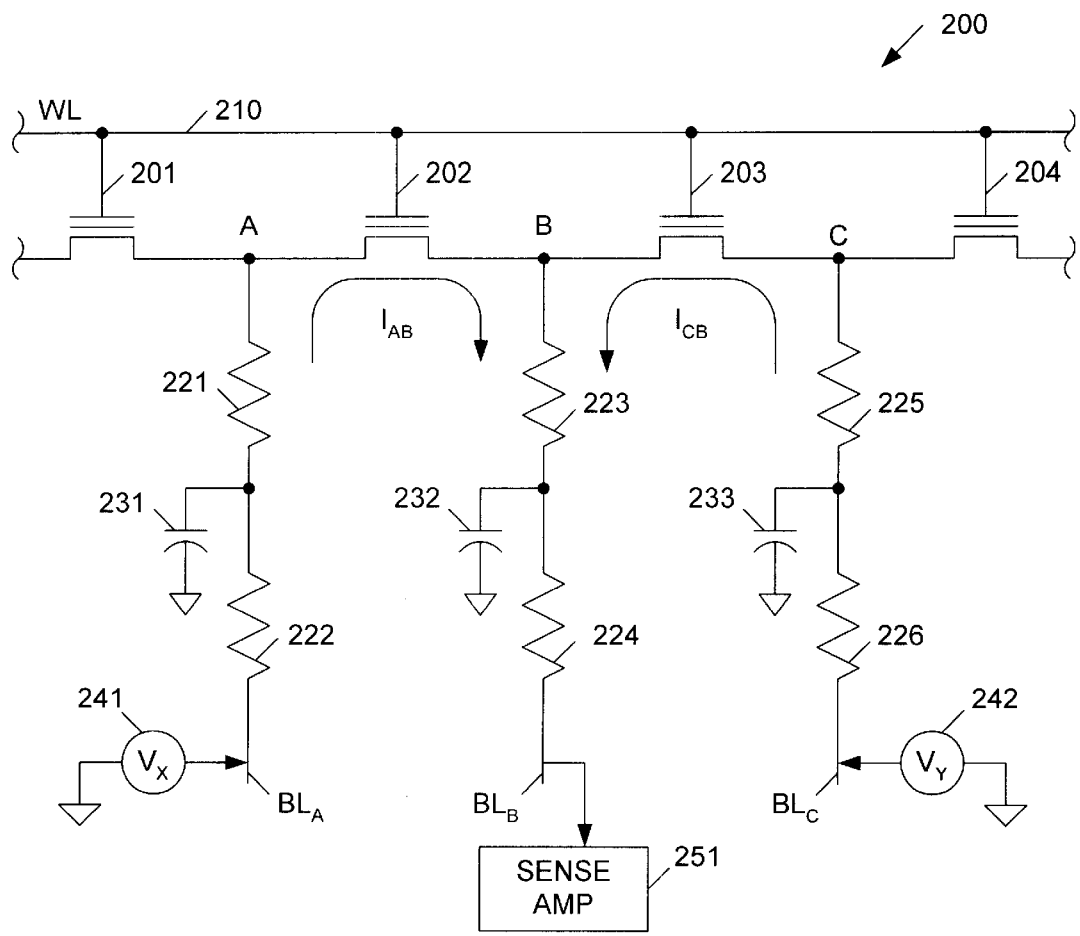
FIG. 2 is a circuit diagram of a portion of a conventional non-volatile memory array.
Figure 3:
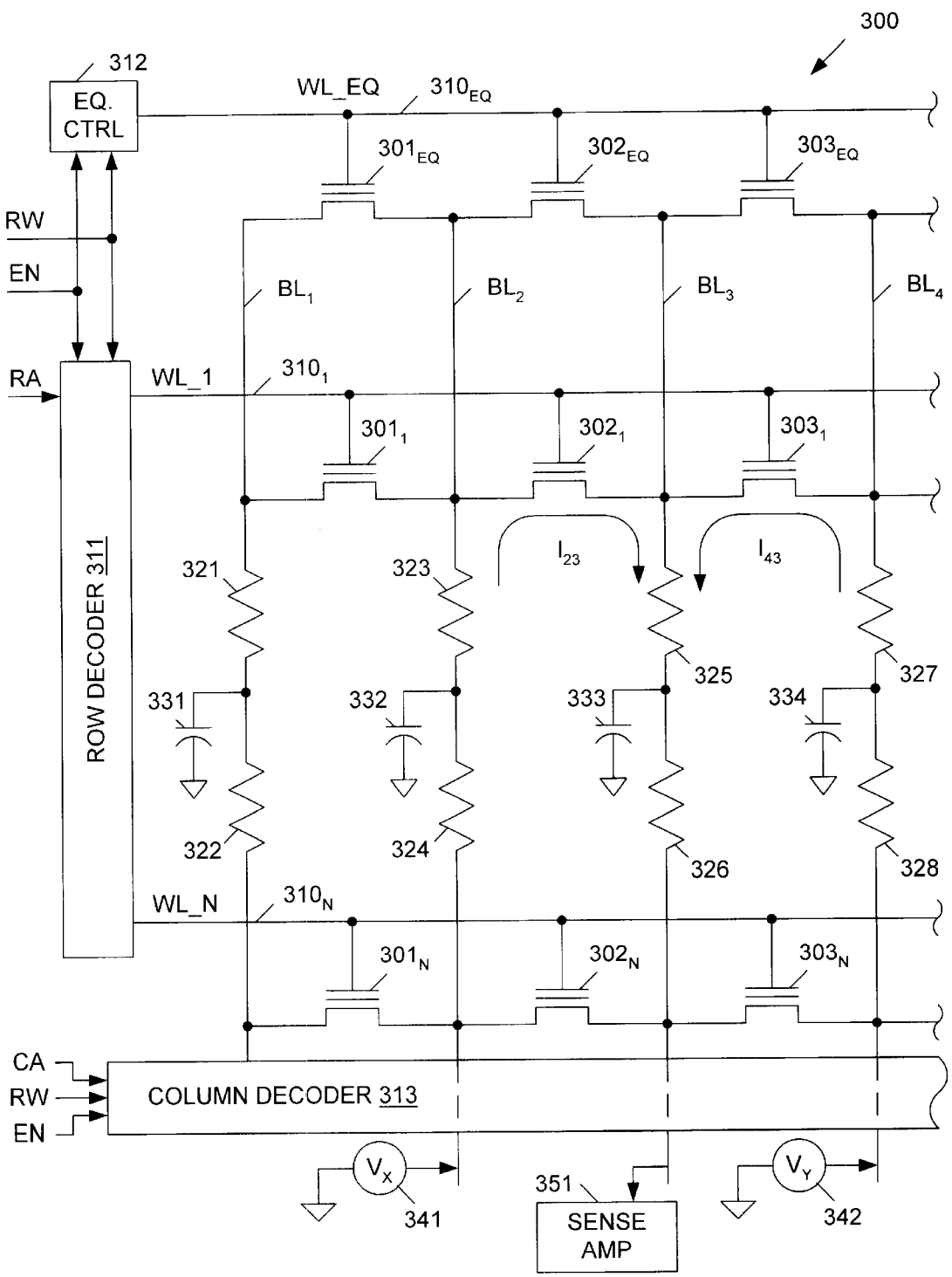
FIG. 3 is a circuit diagram of a non-volatile memory system in accordance with one embodiment of the present invention.

FIG. 3 is a circuit diagram of a non-volatile memory system 300 in accordance with one embodiment of the present invention. Non-volatile memory system 300 includes non-volatile memory cells $301_1$–$303_1$, $301_N$–$303_N$, and $301_{EQ}$–$303_{EQ}$, wherein the subscripts are used to identify the row in which the cells are located. Thus, the subscript "1" identifies the first row of NVM cells used to store data values in system 300. The subscript "N" identifies the last row (and thereby the number of rows) of NVM cells used to store data values in system 300. Rows of NVM cells between row 1 and row N are not shown in FIG. 3 for purposes of clarity. However, such rows are connected in the same manner as rows 1 and N. Moreover, although only three NVM cells are shown in each row of system 300, it is understood that other numbers of NVM cells may be included in each row.

The subscript "EQ" identifies an additional row of NVM cells used to perform an equalization function. Thus, NVM cells $301_{EQ}$–$303_{EQ}$ are not used to store data values in the present invention. Rather, these NVM cells $301_{EQ}$–$303_{EQ}$ are all configured (e.g., erased) to have a low threshold voltage. The reason for this will become apparent in view of the following disclosure.

Non-volatile memory system 300 also includes word lines $310_1$, $310_N$ and $310_{EQ}$, which carry word line signals WL_1, WL_N and WL_EQ, respectively. Word line $310_1$ is coupled to the gates of NVM cells $301_1$–$303_1$, in row 1. Similarly, word line $310_N$ is coupled to the gates of NVM cells $301_N$–$303_N$ in row N. Finally, word line $310_{EQ}$ is coupled to the gates of NVM cells $301_{EQ}$–$303_{EQ}$ in the equalization row. Word line signals WL_1, and WL_N are generated by a row decoder circuit 311 in response to an access enable signal EN, a read/write identifier signal RW, and a row address signal RA. Word line signal WL_EQ is generated by an equalization control circuit 312 in response to the access enable signal EN, and the read/write identifier signal RW.

Non-volatile memory system 300 also includes bit lines $BL_1$–$BL_4$, which are coupled to NVM cells $301_1$–$303_1$, $301_N$–$303_N$, and $301_{EQ}$–$303_{EQ}$ as illustrated. Thus, bit line $BL_1$, is coupled to the first column of NVM cells in the array, bit line $BL_2$ is coupled between the first and second columns of NVM cells in the array, bit line $BL_3$ is coupled between the second and third columns of the array, and bit line $BL_4$ is coupled between the third and fourth columns of the array. The impedance of bit line $BL_1$ is represented by resistors 321–322 and capacitor 331. Similarly, the impedance of bit line $BL_2$ is represented by resistors 323–324 and capacitor 332. The impedance of bit line $BL_3$ is represented by resistors 325–326 and capacitor 333. Finally, the impedance of bit line $BL_4$ is represented by resistors 327–328 and capacitor 334.

Bit lines $BL_1$–$BL_4$ are coupled to column decoder 313. Column decoder 313 couples selected bit lines $BL_1$–$BL_4$ to receive read, program and erase voltages in response to the access enable signal EN, the read/write identifier signal RW, and a column address signal CA. During read cycles, column decoder 313 also couples sense amplifiers, such as sense amplifier 351, to selected bit lines.

Each of the NVM cells of system 300 is a conventional n-channel non-volatile memory transistor, which includes n-type source/drain regions, a p-type channel region, a gate dielectric layer located over the channel and portions of the source/drain regions, a floating gate located over the gate dielectric layer, a second dielectric layer located over the floating gate, and a control gate located over the second dielectric layer. The floating gate can be made of a conductive material, such as conductively doped polysilicon, or a non-conductive material, such as silicon nitride. When the floating gate is made of silicon nitride, each non-volatile memory transistor can be controlled to store 2-bits, in the manner described in U.S. Pat. No. 6,256,231. In other embodiments, p-channel non-volatile memory transistors can be used.

In general, the NVM cells of system 300 can have a programmed state or an erased state. The NVM cells are erased by removing excess electrons from the floating gates of these cells. An erase operation may be performed by applying a relatively high voltage to bit lines $BL_1$–$BL_4$ and a relatively low voltage to word lines $310_1$–$310_N$ and $310_{EQ}$. Under these conditions, electrons stored in the floating gates may tunnel out of the floating gates to the bit lines by Fowler-Nordheim tunneling. Typically, all of the NVM cells in an array (block) are erased at the same time. The illustrated portion of NVM system 300 represents a single block. Note that NVM system 300 may include a plurality of blocks, each having independent control. In this case, each of the blocks can be erased at different times. When an NVM cell is erased, it will exhibit a relatively low threshold voltage. Thus, when read voltages are applied to an erased NVM cell, a relatively high read current will flow through the erased NVM cell.

The NVM cells of system 300 can be selectively programmed by placing electrons on the floating gates of these NVM cells. A program operation may be performed by applying a relatively high voltage to the control gate of a NVM cell, a relatively low voltage to the drain of the NVM cell, and a relatively high voltage to the source of the NVM cell. Under these conditions, electrons pass into the floating gate of the selected NVM cell by hot electron injection. Alternately, selected NVM cells can be programmed by Fowler-Nordheim tunneling. When an NVM cell is programmed, it will exhibit a relatively high threshold voltage. Thus, when read voltages are applied to a programmed NVM cell, a relatively low read current will flow through the programmed NVM cell.

Equalization NVM cells $301_{EQ}$–$303_{EQ}$ are initially erased, such that these cells have a low threshold voltage. These equalization NVM cells $301_{EQ}$–$303_{EQ}$ remain erased during normal operation of system 300. That is, these cells $301_{EQ}$–$303_{EQ}$ are not accessed during subsequent program, erase, or read operations. Rather, these cells $301_{EQ}$–$303_{EQ}$ are only used for shorting all bit lines $BL_1$–$BL_4$, thereby discharging these bit lines $BL_1$–$BL_4$, when the WL_EQ signal is activated on word line $310_{EQ}$. As described in more detail below, equalization NVM cells $301_{EQ}$–$303_{EQ}$ enable bit lines $BL_1$–$BL_4$ to be properly discharged between read cycles, even if one read cycle interrupts a previous read cycle. That is, NVM cells $301_{EQ}$–$303_{EQ}$ ensure that bit lines $BL_1$–$BL_4$ are properly discharged if non-volatile memory system 300 is operated in an asynchronous manner.

Figure 4:
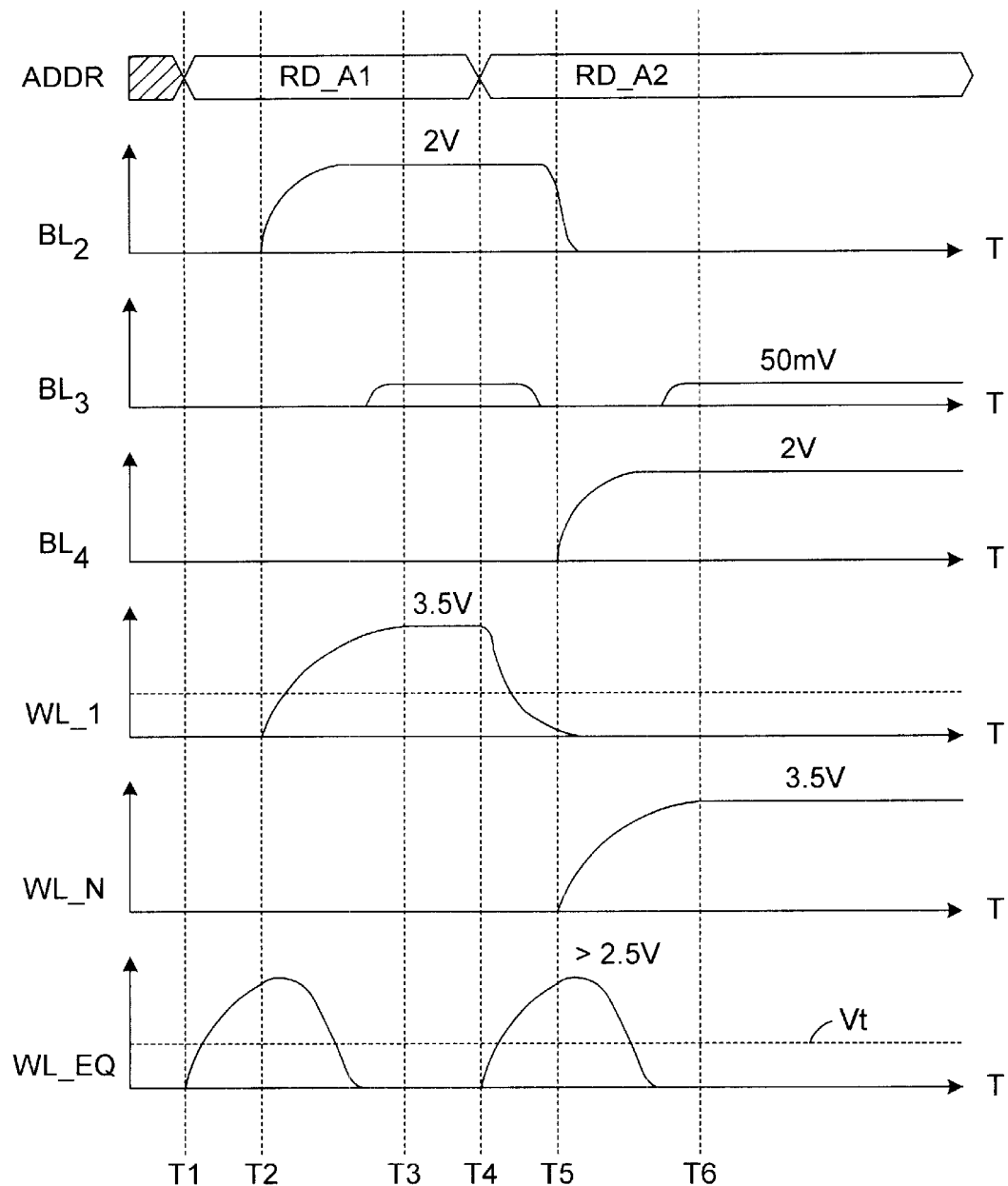
FIG. 4 is a waveform diagram illustrating a manner of operating the non-volatile memory system of FIG. 3 in accordance with one embodiment of the present invention.

FIG. 4 is a waveform diagram illustrating a manner of operating non-volatile memory system 300 in accordance with one embodiment of the present invention. More specifically, FIG. 4 illustrates an address signal ADDR, bit line signals $BL_2$, $BL_3$ and $BL_4$, and word line signals WL_1, WL_N and WL_EQ during two consecutive read cycles. In this example, the second read cycle interrupts the first read cycle. However, as described below, bit lines $BL_2$–$BL_4$ are properly discharged, such that the second read cycle is not adversely affected.

At time T1, a first read cycle is initiated by activating the access enable signal EN (not shown), activating the read/write indicator signal RW (not shown) to indicate a read cycle, and applying a first read address signal RD_A1 to address decoders 311 and 313 of NVM system 300. This first read address RD_A1 identifies NVM cell $302_1$ as one of the cells to be read during the first read cycle. Other cells (not shown) may also be read in parallel during the first read cycle. However, because all of these NVM cells are accessed in the same manner, only NVM cell $302_1$ will be discussed.

Upon initiating any read cycle, the word line signal WL_EQ is activated (in response to the activated EN and RW signals). Thus, at time T1, the voltage level of the WL_EQ signal begins to increase. When the voltage of the WL_EQ signal exceeds the threshold voltages of the erased equalization NVM cells $301_{EQ}$–$303_{EQ}$, as illustrated by the dashed line Vt in FIG. 4, the equalization NVM cells turn on, thereby allowing charges stored on bit lines $BL_1$–$BL_4$ (i.e., on capacitors 331–334) to discharge. Bit lines $BL_1$–$BL_4$ are substantially discharged (equalized) by time T2.

At time T2, the first read address RD_A1 is completely decoded, and row decoder 311 activates a logic high word line voltage on word line $310_1$. Thus, at time T2, the voltage level of the word line signal WL_1 begins to increase.

Also at time T2, column decoder 313 couples read voltage source 341 to bit line $BL_2$, and sense amplifier 351 to bit line $BL_3$. In the described example, read voltage source 341 provides a read voltage $V_X$ that is slightly lower than the word line voltage. For example, if the word line voltage has a magnitude of 3.5 Volts, then the read voltage $V_X$ may have a magnitude of 2.0 Volts. Sense amplifier 351 pulls the voltage on bit line $BL_3$ down toward ground (0 Volts). The period between T1 and T2 is referred to as the decoding period, as the read address RD_A1 is decoded during this period.

Beginning at time T2, the bit line voltage $BL_2$ begins to increase in response to the coupled read voltage source 341. Shortly after time T2, the WL_EQ voltage begins to decrease in magnitude. As the WL_EQ voltage decreases, the equalization NVM cells $301_{EQ}$–$303_{EQ}$ begin to turn off and become less conductive, thereby allowing the bit line voltage $BL_2$ to increase. When the WL_EQ voltage drops below the threshold voltage Vt (prior to time T3), equalization NVM cells $301_{EQ}$–$303_{EQ}$ are turned off, thereby allowing the bit line voltage $BL_2$ to increase to about 2 Volts. Also at this time, sense amplifier 351 causes the voltage on bit line $BL_3$ to increase to a relatively low voltage of about 50 mV. In the described embodiment, the WL_EQ signal is generated in a self-timed manner.

At time T3, the word line voltage WL_1 has reached the desired (maximum) read voltage and the voltage on bit line $BL_2$ has reached the read voltage $V_X$. The time between T2 and T3 is referred to as the set-up period, because the desired read voltages are developed during this period. In the described example, the activated word line voltage WL_1 has a magnitude approximately equal to a $V_{CC}$ supply voltage (e.g., 2.5 Volts, 3.3 Volts, 5.0 Volts) at time T3. The read voltage $V_X$ is less than the $V_{CC}$ supply voltage in the described example.

At time T3, a read current $I_{23}$ flows through NVM cell $302_1$. The read current $I_{23}$ is representative of the programmed/erased state of NVM cell $302_1$. In the described example, NVM cell $302_1$ has a programmed state (i.e., high threshold voltage), such that the read current $I_{23}$ will be relatively low. As a result, capacitor 332 will charge to a relatively high voltage of approximately $V_X$.

At time T4, before sense amplifier 351 has had sufficient time to properly sense the state of read current $I_{23}$, the first read cycle is interrupted by a second read cycle. The second read cycle is initiated by activating the access enable signal EN, activating the read/write indicator signal RW to indicate a read cycle, and applying a second read address signal RD_A2 to address decoders 311 and 313. The second read address RD_A2 identifies NVM cell $303_N$ as one of the cells to be read during the second read cycle.

Upon initiating the second read cycle, the word line signal WL_EQ is again activated. Thus, at time T4, the voltage level of the WL_EQ signal begins to increase. When the voltage of the WL_EQ signal exceeds the threshold voltages of the erased equalization NVM cells $301_{EQ}$–$303_{EQ}$, the equalization NVM cells turn on, thereby allowing the charge previously stored in capacitor 332 to discharge. More specifically, capacitor 332 is discharged through resistors 323–324, and the parallel paths that include resistors 321–322 and 325–328, turned-on transistors $301_{EQ}$–$303_{EQ}$, and capacitors 331 and 333–334. Note that capacitor 332 is also discharged to other bit lines not shown in the view of FIG. 3. Bit lines $BL_1$–$BL_4$ are substantially discharged (equalized) by time T5.

At time T5, the second read address RD_A2 is completely decoded, and row decoder 311 activates a logic high word line voltage on word line $310_N$. Thus, at time T5, the voltage level of the word line signal WL_N begins to increase.

Also at time T5, column decoder 313 couples read voltage source 342 to bit line $BL_4$ and sense amplifier 351 to bit line $BL_3$. In the described example, read voltage source 342 provides a read voltage $V_Y$ (which is equal to the read voltage $V_X$) to bit line $BL_3$. Sense amplifier 351 pulls the voltage on bit line $BL_3$ down toward ground (0 Volts).

Beginning at time T5, the bit line voltage $BL_4$ begins to increase in response to the coupled read voltage source 342. Shortly after time T5, the WL_EQ voltage begins to decrease in magnitude. As the WL_EQ voltage decreases, the equalization NVM cells $301_{EQ}$–$303_{EQ}$ begin to turn off and become less conductive, thereby allowing the bit line voltage $BL_4$ to increase. When the WL_EQ voltage drops below the threshold voltage Vt (prior to time T6), equalization NVM cells $301_{EQ}$–$303_{EQ}$ are turned off, thereby allowing the bit line voltage $BL_4$ to increase to about 2 Volts. Also at this time, sense amplifier 351 causes the voltage on bit line $BL_3$ to increase to a relatively low voltage of about 50 mV.

At time T6, the word line signal WL_N has reached the desired (maximum) read voltage and the voltage on bit line $BL_4$ reaches the read voltage $V_Y$.

At time T6, a read current $I_{43}$ flows through NVM cell $303_N$. The read current $I_{43}$ is representative of the programmed/erased state of NVM cell $303_N$. In the described example, NVM cell $303_N$ has a programmed state (i.e., high threshold voltage), such that the read current $I_{43}$ will be relatively low. Because capacitor 332 was properly discharged during the period between T4 and T5, the charge remaining on capacitor 332 is too small to have any affect on the second read cycle. That is, the charge remaining on capacitor 332 is inadequate to generate a significant current from bit line $BL_2$ to bit line $BL_3$ through NVM cell $302_N$. As a result, sense amplifier 351 is able to properly detect the logic low state of the read current $I_{43}$.

Although the present invention has been described in connection with several embodiments, it is understood that this invention is not limited to the embodiments disclosed, but is capable of various modifications, which would be apparent to a person skilled in the art. Thus, the invention is limited only by the following claims.

What is claimed is:

1. A non-volatile memory (NVM) system comprising:
   an array of NVM cells arranged in rows and columns, wherein the array includes a row of equalization NVM cells, each of the equalization NVM cells being maintained in a low threshold voltage state during normal operation of the array; and
   an equalization control circuit configured to activate an equalization control signal at the beginning of each read cycle of the NVM system, the equalization control signal being applied to the equalization NVM cells, thereby turning on the equalization NVM cells at the beginning of each read cycle.

2. The NVM system of claim 1, wherein the equalization control circuit is configured to activate the equalization control signal in response to an access enable signal and a read/write indicator signal.

3. The NVM system of claim 1, further comprising a row access decoder configured to apply an activated word line voltage to an addressed row of NVM cells in the array, wherein the addressed row of NVM cells is a row of NVM cells other than the row of equalization NVM cells.

4. The NVM system of claim 1, wherein the row of equalization NVM cells includes an equalization word line coupled to a control gate electrode of each of the equalization NVM cells, the equalization control circuit being configured to apply the equalization control signal to the equalization word line.

5. The NVM system of claim 1, wherein each of the NVM cells has a single-transistor structure.

6. The NVM system of claim 5, wherein the single-transistor structure includes a conductive polysilicon floating gate.

7. The NVM system of claim 5, wherein the single-transistor structure includes a silicon nitride floating gate capable of storing 2-bits.

8. The NVM system of claim 1, wherein adjacent columns of the array share a common bit line.

9. The NVM system of claim 8, wherein each of the equalization NVM cells is coupled across adjacent bit lines.

10. The NVM system of claim 1, wherein the equalization NVM cells share a common set of bit lines with other NVM cells in the array.

11. A method of operating an array of non-volatile memory (NVM) cells arranged in a plurality of rows and columns, the method comprising:
    detecting the initiation of a read cycle of the array; and
    turning on the NVM cells in a row of the array upon detecting the initiation of the read cycle, thereby coupling bit lines of the array to each other to equalize voltages on the bit lines.

12. The method of claim 11, further comprising maintaining each of the NVM cells in the row of the array to have a low threshold voltage.

13. The method of claim 12, further comprising:
    generating an equalization control signal upon detecting the initiation of a read cycle; and
    applying the equalization control signal to control gates of each of the NVM cells in the row of the array.

14. The method of claim 13, further comprising generating the equalization control signal in response to an access enable signal and a read/write indicator signal.

15. The method of claim 13, wherein the equalization control signal is generated in a self-timed manner.

16. The method of claim 11, wherein the read cycle includes a decoding period, a set-up period and a sensing period, wherein the step of equalizing is completed before the sensing period.

17. The method of claim 16, wherein the step of equalizing is performed during the decoding period and the set-up period.

18. The method of claim 16, further comprising isolating the bit lines of the array prior to the sensing period.

19. The method of claim 18, wherein the step of isolating the bit lines comprises turning off the NVM cells in the row of the array.

* * * * *